US012117212B2

(12) United States Patent
Romanello et al.

(10) Patent No.: US 12,117,212 B2
(45) Date of Patent: Oct. 15, 2024

(54) TWO-PHASE COOLING SYSTEM WITH FLOW BOILING

(71) Applicants: Francesco Romanello, Rome (IT); Luca Saraceno, Anguillara Sabazia (IT); Antonio Scotini, Rome (IT); Giuseppe Zummo, Rome (IT)

(72) Inventors: Francesco Romanello, Rome (IT); Luca Saraceno, Anguillara Sabazia (IT); Antonio Scotini, Rome (IT); Giuseppe Zummo, Rome (IT)

(*) Notice: Subject to any disclaimer, the term of this patent is extended or adjusted under 35 U.S.C. 154(b) by 629 days.

(21) Appl. No.: 17/284,620

(22) PCT Filed: Oct. 14, 2019

(86) PCT No.: PCT/IB2019/058724
§ 371 (c)(1),
(2) Date: Apr. 12, 2021

(87) PCT Pub. No.: WO2020/075148
PCT Pub. Date: Apr. 16, 2020

(65) Prior Publication Data
US 2021/0341185 A1    Nov. 4, 2021

(30) Foreign Application Priority Data
Oct. 12, 2018   (IT) .................. 102018000009390

(51) Int. Cl.
*F25B 23/00*   (2006.01)
*F25B 39/00*   (2006.01)
(Continued)

(52) U.S. Cl.
CPC ............ *F25B 23/006* (2013.01); *F25B 39/00* (2013.01); *F25B 43/04* (2013.01); *F25B 49/005* (2013.01);
(Continued)

(58) Field of Classification Search
CPC ........ F25B 23/006; F25B 39/00; F25B 43/04; F25B 49/005; F25B 2600/111; F25B 2600/13; F25B 2700/2117
See application file for complete search history.

(56) References Cited

U.S. PATENT DOCUMENTS

2008/0030956 A1   2/2008   Silverstein et al.
2012/0137718 A1   6/2012   Uchida et al.

FOREIGN PATENT DOCUMENTS

EP   2 801 780   11/2014
EP   3 293 469   3/2018
(Continued)

OTHER PUBLICATIONS

International Search Report and Written Opinion of the ISA for PCT/IB2019/058724 mailed Nov. 13, 2019, 11 pages.

*Primary Examiner* — Elizabeth J Martin
(74) *Attorney, Agent, or Firm* — NIXON & VANDERHYE (57) ABSTRACT

A two-phase cooling system with flow boiling, characterized in that a closed hydraulic circuit apparatus of a heat transfer refrigerating fluid is provided, including: a pump for a refrigerating fluid which, at least in some stretches of the circuit, is two-phase liquid-vapor or multi-phase; a heat sink-evaporator configured to transfer heat by conduction from a component to be cooled to the refrigerating fluid; a condenser, capable of condensing the vapor which develops on the evaporator while simultaneously dissipating the heat given by the refrigerating fluid both by conduction, convection and radiation and by condensation into the environment; a tank which also acts as an expansion vessel, or a tank and an expansion vessel which are distinct and connected to each other; and a plurality of sensors, including flow rate, pressure and temperature sensors and an electronic control system of the pump.

19 Claims, 5 Drawing Sheets

(51) Int. Cl.
*F25B 43/04* (2006.01)
*F25B 49/00* (2006.01)

(52) U.S. Cl.
CPC ..... *F25B 2600/111* (2013.01); *F25B 2600/13* (2013.01); *F25B 2700/2117* (2013.01)

(56) References Cited

FOREIGN PATENT DOCUMENTS

Section A-A

Section A—A

FIG. 8

TWO-PHASE COOLING SYSTEM WITH FLOW BOILING

This application is the U.S. national phase of International Application No. PCT/IB2019/058724 filed Oct. 14, 2019 which designated the U.S. and claims priority to IT Patent Application No. 102018000009390 filed Oct. 12, 2019, the entire contents of each of which are hereby incorporated by reference.

BACKGROUND OF THE INVENTION

Field of the Invention

The present invention relates to a heat sink/exchanger for a cooling apparatus adapted to transfer heat from a component which generates thermal energy (mainly for electronic devices, such as the CPU, GPU or larger devices in various possible configurations) to a heat transfer fluid (refrigerating fluid), as well as an operating method of the entire cooling system.

The heat source could be a device which generates high thermal power densities, and therefore not limited to a microchip (CPU, GPU, LED, etc.), an integrated circuit or a battery or any component which produces high thermal power densities up to 1000 W/cm$^2$ and more.

SUMMARY OF THE INVENTION

As a result, the present invention is suitable for a wide variety of applications, from electronic cooling devices, electrical devices, mechanical cooling devices to chemical cooling reactions and/or related devices and processes.

A better understanding of the invention will be achieved by means of the following detailed description and with reference to the figures, which illustrate a preferred embodiment of the invention by way of non-limiting example and of some variants thereof.

DESCRIPTION OF THE PREFERRED EMBODIMENTS

Hereinafter, for the sake of simplicity of presentation, reference will be made to an example of embodiment with a two-phase fluid, i.e. with a liquid phase and vapor phase, but the inventive concept underlying the invention is also applicable without modification to multi-phase fluids, in which incondensable gases and/or solids, such as (but not limited to) nanoparticles, may be present in addition to the liquid phase and the gaseous phase of the evaporated fluid.

The two-phase cooling system with flow boiling according to the present invention exploits the physical phenomena of convection, conduction, evaporation and radiation and substantially consists of a closed hydraulic circuit apparatus of a heat transfer refrigerating fluid comprising:
  means for pumping a refrigerating fluid which, in some stretches of the circuit, is two-phase;
  a heat sink-evaporator capable of transferring heat by conduction from a component to be cooled to the refrigerating fluid,
  a condenser-radiator, capable of condensing the vapor which develops on the evaporator while simultaneously dissipating the heat given by the refrigerating fluid both by conduction, convection and radiation and by condensation into the environment or into a cold sink or into another fluid;
  an optional heat exchanger (recuperator), which transfers heat from the fluid exiting the evaporator to the fluid entering the evaporator itself;
  a tank which acts as expansion vessel or a tank and expansion vessel connected to each other;
  sensors and an electronic control system of the pump, of the air flow to the condenser and of the pressure.

According to a particular feature of the invention, the hydraulic circuit is a closed loop in which the refrigerating fluid, which is present in two or multiphase state is circulated by a pump. According to the invention, this refrigerating fluid initially starts from the pump totally in liquid phase, when it reaches the element to be cooled, it passes partially from the liquid state to the vapor state with an optimal percentage definable by the system parameters and controllable by an electronic system which regulates the pump flow rate, the speed of the fans which cool the condenser and the system pressure, in order to keep the evaporation and the temperature of the element to be controlled at the desired level.

Evaporation phenomena therefore occur on the heat sink which, for this reason, is also indicated as evaporator, in which heat is transferred from the heat source to the fluid by means of a series of physical phenomena: convection, heat conduction, evaporation, radiation.

According to a further particular feature of the invention, if the vapor content (vapor quality) is controlled, heat dissipation is maximized because it also extracts the latent heat of vaporization, thus obtaining results that the current technique does not allow. However, in order to do this, it is important not only to manage the evaporation control and the successive condensation by means of sensors arranged in an appropriate position in the circuit which send their signals to an electronic control board which controls: the pump flow rate, the condenser fan speed, as well as the pressure regulation system, but it is also important to provide an evaporator capable of subtracting as much heat as possible from the component to be cooled.

For this purpose, it is necessary to manage the evaporator/component interface to be cooled, but also to use the best materials for the making of the evaporator and its geometry on fluid side.

Figure 1:
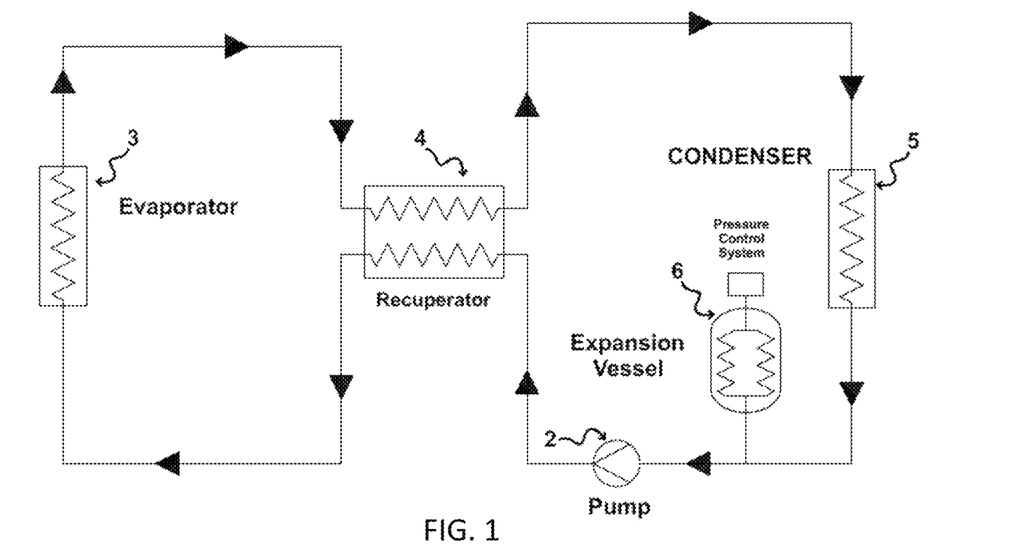
FIG. 1 shows a two-phase flow cooling system of known type.

A typical two-phase cooling system is shown in FIG. 1, in which a closed loop system 1 with a pump 2 is provided to circulate a working fluid. Downstream of the pump, the fluid flows towards an evaporator 3, which is the heat exchanger in which the liquid evaporates, whereby absorbing the heat of the component to be cooled (electronic device: CPU, GPU, IGBT, inverter, etc.).

According to the present invention, the two-phase or multi-phase mixture of fluid coming out of the evaporator may pass through a heat exchanger 4 (liquid-liquid, indicated like a "recuperator" in the diagram in FIG. 1) and give either part or all of the heat accumulated to the fluid entering the evaporator, whereby achieving a sort of preheating. Such a recuperator may be present in some applications. At the outlet of the recuperator, the two-phase or multi-phase fluid thus flows to a condenser 5, in which the vapor condenses again in liquid phase and the heat is transferred from the fluid to the environment or to the heat sink. The circuit contains, as mentioned, a storage tank-accumulator 6 which ensures expansion to allow variations in fluid density and thus changes in volume due to evaporation and condensation. This storage tank controls the system pressure and therefore the fluid saturation temperature. This temperature is settable to maintain the electronic components at their operating temperatures. In a computer, for example, CPU and GPU should operate in a temperature range from 25° C. to 60° C. and should not exceed 85-100° C.

Advantageously, an innovative heat control system, such as the one described herein, can remove high heat densities with low mass flow rate of the refrigerating fluid and of maintaining the surface of the electronic component isothermal. In addition to providing the above benefits, the system according to the present invention is characterized by smaller volumes and masses compared to those of known cooling technologies: as a result, it requires less energy for its operation. In addition to these advantages, there is also reduced system noise.

Compared to the solutions known in the art, diagrammatically shown in FIG. 1, the present invention contains original and innovative elements represented by the evaporator 3, as well as the control and regulation system of the flow rate, pressure and air flow on the condenser.

Hereafter, this invention will be described in greater detail, with particular reference to the innovative heat transfer method related to the described heat sink, with reference to FIGS. 2 to 7, which show only by way of example a preferred, non-binding embodiment (and some of its variants).

The heat sink-evaporator 3 comprises a housing consisting of:
 a base 7 (FIGS. 2 and 3) and of
 a cover 8
which together define obligatory passages for the refrigerating fluid.

These obligatory passages can also be defined by the presence of additional elements, such as baffles, conveyors or reducers.

The base 7 is a thermal conductive material plate, with a lower surface 9 in contact with the device to be cooled and an upper surface 10 on which a plurality of preferably (but not exclusively) mutually parallel fins 11 are present which define a corresponding plurality of channels 12. According to the invention, each of said channels 12 is delimited by two adjacent fins 11 and by the surface of the base itself present therebetween. The upper side of each channel 12 may be closed by the bottom surface of the cover 8 or it can be opened, in which case the cover is placed at a given distance from the free end of the upper part of the fins 11. In the example shown, the cover 8 is a plate which can contain manifolds 13 (mainly the inlet and the outlet) and possibly other channels.

Between the base 7 and the cover 8 there is a system of seals to ensure the hydraulic tightness of the system.

It is also possible to provide that between the cover 8 and the base 7 there is a spacer element which may contain the sealing system or not to ensure the hydraulic sealing of the heat sink, respectively with the base and with the cover.

Another particular feature of the invention is that the channels (also named micro-channels) present on the upper surface 10 of the exchanger may all have the same length or lengths which are not uniform.

Furthermore, the height of the fins 11 which define the channels 12 can also be either uniform or uneven. In case of non-uniform height, the fins 11 may have decreasing heights in linear, quadratic, cubic, etc. manner from an inlet or outlet side to the opposite side. Alternatively, they may have decreasing heights from the center toward the ends or vice versa.

Furthermore, the fins 11 may have a discontinuous surface, i.e. with openings or holes which connect a channel with at least one adjacent channel. The upper free end, or edge, of the fins can also be discontinuous.

Finally, the body of the fins 11 may be orthogonal to the surface of the base or have a given inclination with respect thereto.

Figure 4:
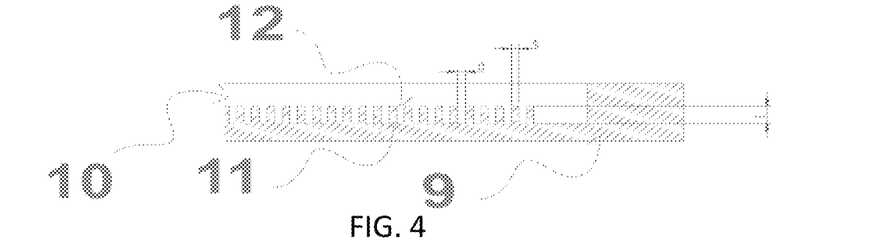
FIG. 4 is a diagram of the geometric parameters of the finned surface of the evaporator.

FIG. 4 shows the geometrical parameters "a", "b" and "c" of the fins 11 which define the channels 12 (which hereafter will also be named "micro-channels").

In the preferred embodiment described by way of non-limiting example, the values of these three parameters are:
 a: the thickness of a fin: 0.1 mm-1.0 mm
 b: distance between two fins: 0.1 mm-2.0 mm
 c: height of a fin: 0.1 mm-5.0 mm Another particular feature of the invention is in that the refrigerating fluid flow may be either parallel or transverse to the axis of the channels 12, or oblique thereto if the channels are arranged according to an angle with respect to the flow axis.

The wetted surface may contain a pair of peripheral channels A 14 and B 15 (FIG. 2) in relation to the finned surface, which act as inlet/outlet plenum (manifolds) or conveyors according to the fluid flow direction. These channels, which mainly function as channels to allow easy removal of vapor from the heat transfer surface, may also be obtained in the cover 8.

The surface of the micro-channels 12 may be polished or sandblasted or may be rough with a Ra roughness parameter preferably within the range: 0.01 micron-500 microns.

This surface may have micro-structures consisting of, by way of non-limiting example:
 sintered powder with particle size in the range: 0.05 μm-1000 μm;
 special paint or coating: 3M© coating system;
 paint or coating:
 chemical finishes or chemical surface treatments.

The lower surface of the base can be flat or assume a concave or convex curvature.

The radius of curvature may be comprised within the range: 3000-7000 mm

The lower surface finish can be rough or smoothed with a roughness described by the Ra parameter in the range: 0.05 μm-500 μm.

The base 7 may have any plan shape, such as (but not limited to): square, circular, rectangular, hexagonal, octagonal, etc.

For quadrangular bases, dimensions may vary from 10 mm×10 mm to 120 mm×120 mm and more.

For circular symmetry bases, the diameter can vary from 10 mm to 120 mm and more.

The base 7 could also be inscribed in a circle of a few millimeters in diameter up to 120 mm and more, according to the applications.

For rectangular shapes, the ratio of the longest side to the shortest side is preferably 1 to 7 and more.

It is worth noting that in addition to these geometric configurations of single evaporator construction solutions, modular solutions of two or more evaporators can be provided to cool large surfaces and/or surfaces with complex geometry, or more surfaces at the same time. In such modular configurations, the single evaporators can be arranged on the surfaces to be cooled according to matrices of various shapes (e.g. 1×2, 4×4, 3×5 etc.) and the hydraulic connections, between the same evaporators, can be in series or in parallel or series/parallel combinations.

The channels 12 delimited by the fins 11 can have the longitudinal axis parallel or inclined with respect to one of the sides.

Furthermore, different geometries are possible: such as V-shaped channels, wavy, fretted, etc.

The following is worth noting with regard to the operation of the heat and hydraulic exchange of the heat sink described above.

Figure 2:
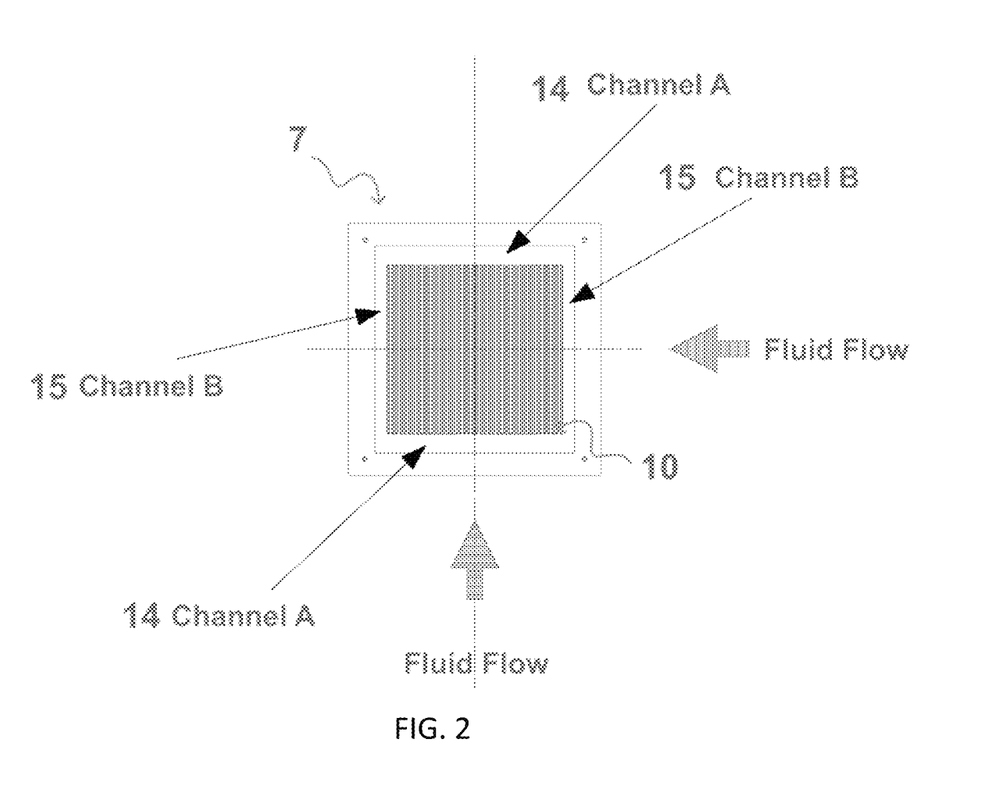
FIG. 2 is a plan view of the base plate of an evaporator according to the present invention.
Figure 3:
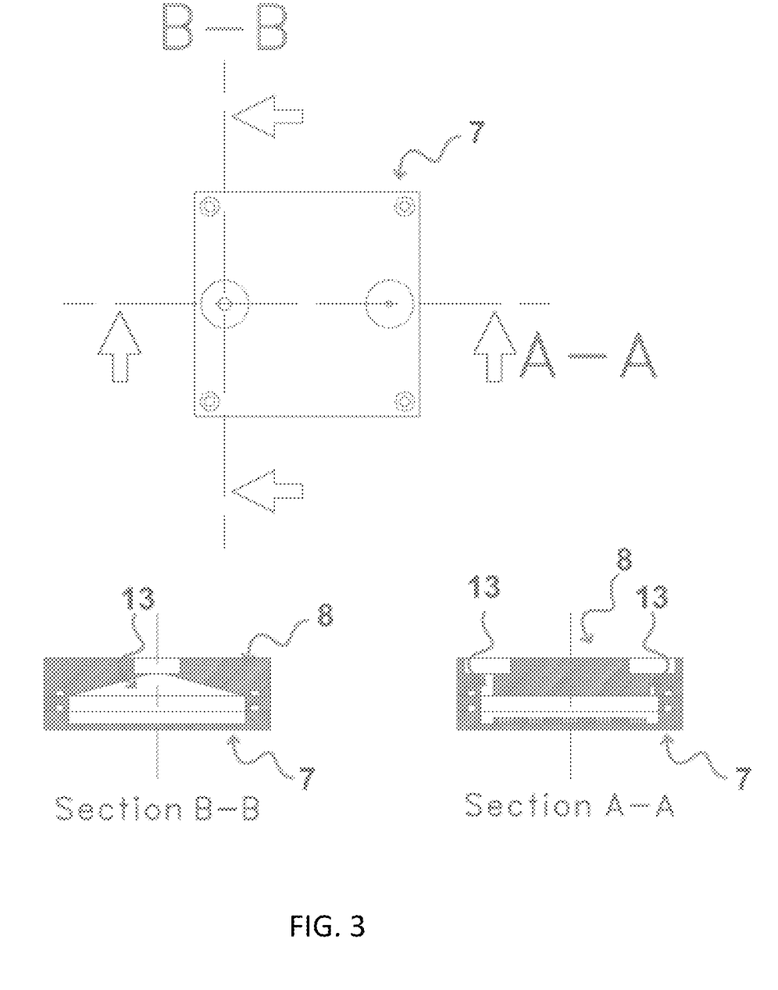
FIG. 3 is a plan view of an exchanger-evaporator according to the present invention, together with two sections taken along respective plotting planes A-A and B-B.

The flow direction may be parallel to the longitudinal axis of the micro-channels 12 (upward vertical arrow in FIG. 2) or transverse to the longitudinal axis of the micro-channels 12 (left horizontal arrow in FIG. 2).

The fluid flow rate can vary over a wide range, up to 1000 kg/h and more.

The average speed of the fluid in the central section of the heat exchanger can vary from 0 to 30 m/s and more.

The heat transfer from the base 7 to the refrigerating fluid takes place at least according to the heat exchange methods described below in a non-exhaustive manner.

The refrigerating fluid is conveyed into the heat sink casing through an inlet manifold, from which it either flows along the side of base plate with micro-multi channels and flows towards the outlet, or flows towards the center of the base plate and is divided into two flows towards the two ends continuing to the outlet.

Figure 5:
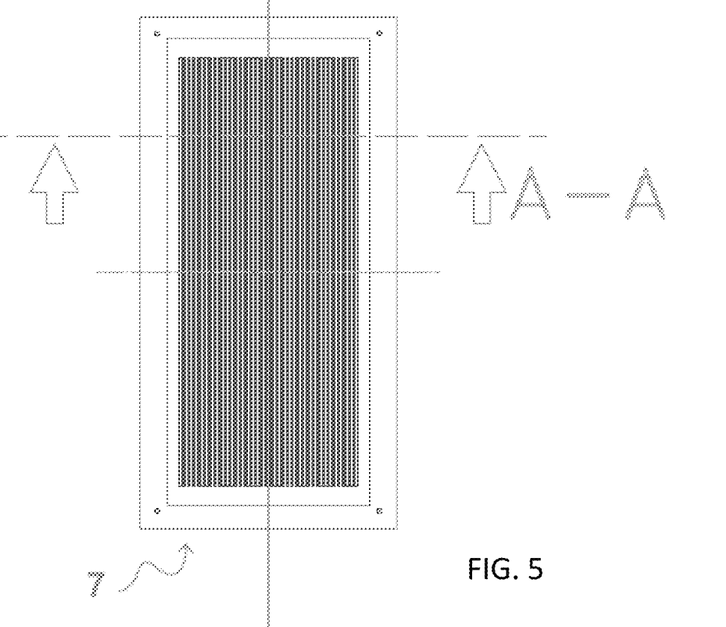
FIG. 5 shows a first variant of the evaporator, which has an elongated plate with channels parallel to the longest side.
Figure 6:
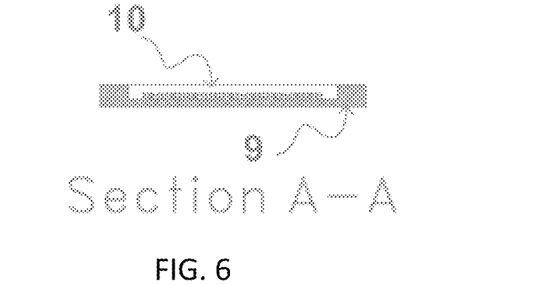
FIG. 6 is a section taken along a plotting plane A-A of the elongated plate in FIG. 5.
Figure 7:
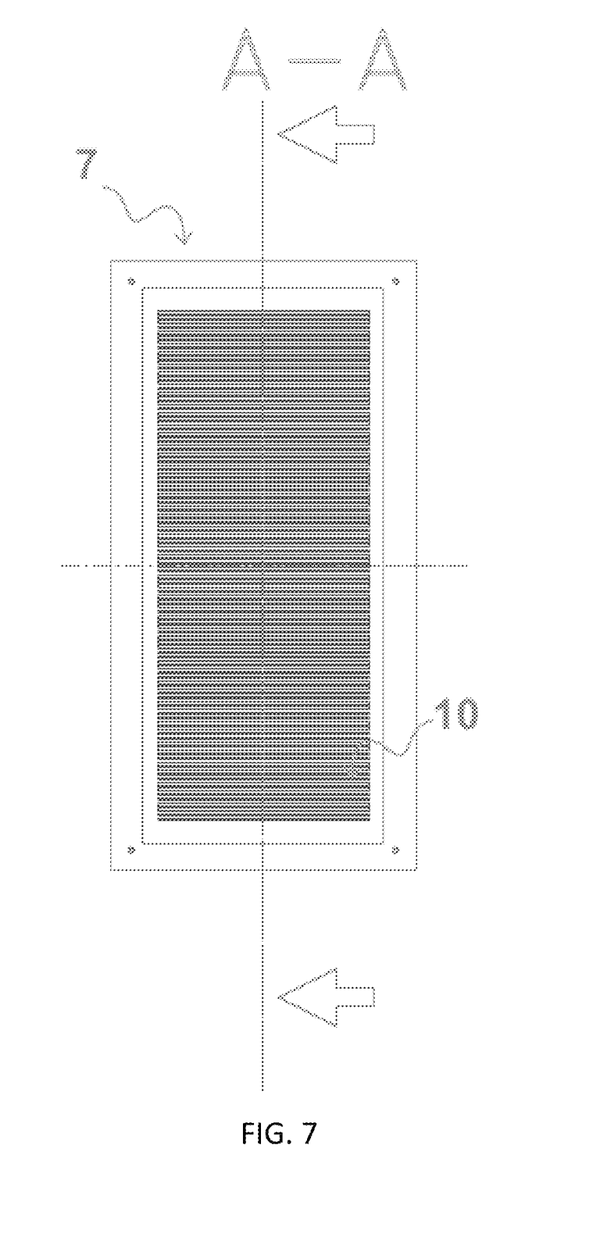
FIG. 7 shows a second variant of the evaporator, which has an elongated plate with channels parallel to the shorter side.
Figure 8:
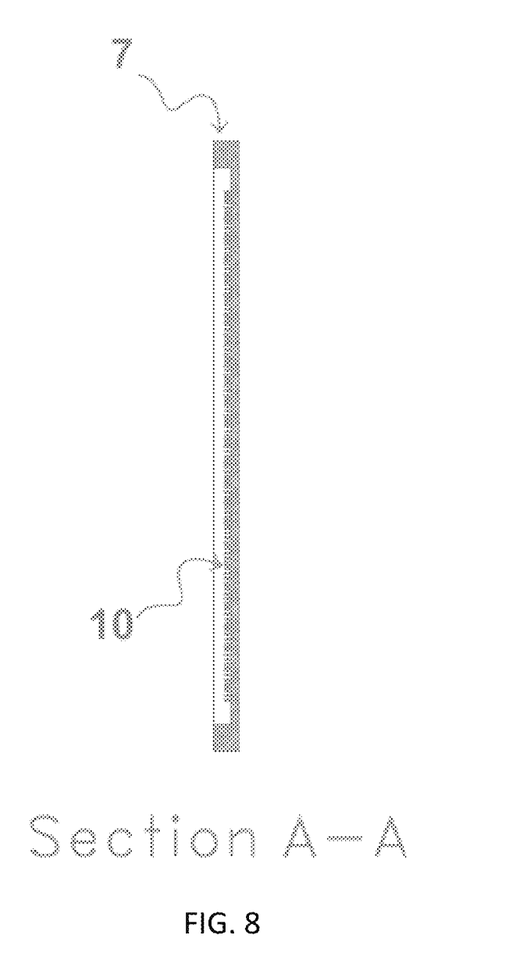
FIG. 8 is a section taken along a plotting plane A-A of the elongated plate shown in FIG. 7.

In some preferred configurations, such as those shown in FIGS. 2, 5 and 7, the fluid is pushed through an inlet pipe obtained from the thickness of the cover 8. The flow direction is orthogonal, from top to bottom (or vice versa), to the plate itself. In other configurations, the manifold 13 can be integrated into the finned plate 7 in a direction parallel to the base of the plate or orthogonal. In such a case, the plate has a preferably extended configuration to accommodate the manifold.

The geometry of the manifold 13 may be triangular, rectangular or may have other shapes, even complex, according to the application or the overall dimensions which are available or to optimize the distribution of flow rates in the individual channels 12. The inner surface of the manifold 13 can be optimized to reduce pressure losses, to improve flow distribution in the micro-channels 12, or to have sharp edges to promote the formation of vapor (e.g. by generating cavitation or turbulent motions). Furthermore, there may be a section shrinkage at the inlet of the manifold 13 to either reduce or eliminate the instability of the two-phase fluid in the heat exchanger 3.

Finally, the refrigerating fluid flows out of the heat sink casing through an outlet manifold, to which the same considerations concerning the shape and direction of flow as described for the inlet manifold apply.

The fluid can enter the heat exchanger 3 in subcooled conditions, with the average temperature of the fluid lower than saturation temperature, or it can enter in saturation conditions with an average temperature equal to about the saturation temperature (it can also have a slightly lower or higher temperature). The inlet fluid is generally in liquid state, but it can also be in two-phase conditions with presence of vapor or gaseous phase due to air or other incondensable gases.

During the flow to the outlet of the heat exchanger 3, the fluid passes from the liquid phase to the vapor phase in the micro-channels 12. In some cases, the fluid may change phase in the side manifolds (A 14 or B 15) and/or the inlet manifold.

As a result, the main heat transfer takes place between the base of the heat exchanger 3 and the refrigerating fluid flowing inside the exchanger itself. Furthermore, if the surface of the component to be cooled is smaller than the surface of the base of the evaporator, there is an additional heat transfer between the fluid and the surface of the heat exchanger not coupled to the component to be cooled. Such a heat exchange takes place as soon as the fluid temperature is higher than the ambient temperature in which the exchanger is immersed.

In this regard, it is worth noting that the cover 8 and any spacer between the cover and the finned base 7 may be made of transparent material (Pyrex, glass, sapphire, polycarbonate, acrylic or other) or plastic, metal, ceramic, carbon fiber or glass or other materials. As a function of their thermal conductivity, such materials may either contribute or not to the transfer of heat to the outside environment.

Different heat exchange methods occur during the flow of the fluid in two-phase or multi-phase conditions (liquid-vapor mixture and/or incondensable gases and/or nanoparticles and/or a combination thereof):
  convection,
  thermal conduction,
  phase change,
  radiation.

Convection can be either forced or natural. However, the latter mechanism has a minimal influence compared to other heat transfer methods. Convection is due both to the motion of the liquid-vapor mixture, of the vapor or gas bubbles and to the motion of the individual liquid, vapor and gaseous phases or to the motion of any other phases present in the fluid (e.g. in the case of the presence of nanoparticles). These motions generate turbulences which increase the transfer of heat in the various phases, mainly the liquid phase.

Thermal conduction is present when there are temperature differences between the various portions of fluid, mainly in the liquid phase. Such differences can be generated by the mixing due to the sudden change of direction of the fluid particles and to the turbulence and turbulence phenomena induced by the presence of the vapor phase or by the other phases (gaseous and/or solid).

Boiling (phase change) is the main mechanism of heat transfer.

Evaporation occurs both by nucleation, i.e. by the formation of vapor bubbles on the surface of the channels, and by evaporation of the liquid film trapped between the vapor phase and the wall of the channel.

The orientation of the finned plate 7 is defined by the direction of the normal axis at the bottom of the plate. There may be various orientations with respect to the force of gravity: horizontal with fins 11 facing upwards, vertical with fluid from bottom to top, horizontal with fins facing downwards, vertical with fluid from top to bottom.

In addition to these main orientations, other possible orientation may also be provided.

In addition to these orientations with respect to the force of gravity, there are also orientations with respect to accelerations to which the plate is subjected, e.g. when the cooling system is mounted on a moving vehicle. Such accelerations generate forces of inertia which are added to the force of gravity.

The term "refrigerating fluid" is used to indicate a heat transfer fluid consisting of any fluid able to evaporate and condense under the operating conditions (temperatures and pressures) of the cooling systems 1 for the various applications.

A variety of cooling system fluids can be selected based on cost, desired optimization type, operating pressure, boiling point, safety regulations, target temperature range (typically 30-85° C. for an electronic device or even higher for military devices or other special applications, but also low ambient temperatures down to −273° C.) of the heat source, material compatibility, environmental compatibility, stability, etc.

Typical pure fluids which can be used as refrigerating fluid for the cooling system are: water, dielectric fluids, alcohols (ethanol, methanol, iso-propanol, etc.), refrigerating fluids (R245fa, R136a, etc.), natural refrigerating fluids such as ammonia, carbon dioxide ($CO_2$), 3M™ Novec™ (7000, 7100, 649, etc.), other fluids of 3M (e.g. FC 72) or other brands, as well as fluids such as acetone, metals in liquid form, cryogenic fluids (e.g. liquid helium), etc.

Furthermore, mixtures consisting of various fluids in addition to those mentioned above may also be used for cooling systems. Such mixtures can have relative concentrations which vary according to the specific application and the type of optimization desired (target temperatures of the component to be cooled, for example). It also means mixtures with incondensable gases (e.g. air) and/or with nanoparticles, i.e. with the presence of solid or colloidal particles in various concentrations.

It is also worth noting that, according to the present invention, the base plate 7 of the heat sink/evaporator 3 is preferably made of highly thermally conductive materials, such as copper, aluminum, graphite, silver, etc. according to the application for which it is intended, but also of composite materials containing carbon fiber, ceramics, graphite, etc., as well as metal alloys. As mentioned, transparent materials (Pyrex, glass, sapphire, polycarbonate, acrylic, etc.) or plastics or mixtures of these materials with metallic particles may also be used to improve thermal conductivity.

Various materials such as those described for the base plate 7 can also be used for the cover 8.

The base plate 7 of the heat sink/evaporator 3 can also be manufactured using metal sintering techniques (such as: copper and molybdenum, copper and graphite, aluminum and graphite, etc. and other materials; or by chip forming techniques with CNC machines, 3D printing techniques of the additive manufacturing type (SLS, Selective Layer Sintering or DMLS, Direct Metal Laser Sintering) or other mechanical processes, such as for example skiving, brazing, extrusion rolling, stamping, etc.

In order to maximize the heat exchange towards the refrigerating fluid, the evaporator/liquid interface surface on which these fins 11 are made can be treated chemically and/or mechanically.

In the preferred embodiment described above, the two-phase fluid cooling system 1 described above further comprises: a low flow pump 2, an appropriate expansion tank 6, an optional heat exchanger (recuperator 4) between the two-phase or multi-phase fluid leaving the evaporator 3 and the fluid entering the evaporator itself, a condenser 5 (liquid/air heat exchanger) with attached ventilation fans for heat dissipation, an electronic control system including sensors, actuators connected to an electronic control unit, all connected with pipes with lengths and diameters configured to achieve the results of maximizing heat dissipation.

According to the present invention, it is also possible to provide a variant (not shown), in which the inlet of the refrigerating fluid is:
either tangential or oblique to the upper surface or to the base of the fins 11,
or
from above, perpendicular to the finned base 7, in the center of the base or along lines or surfaces on the top surface of the heat sink/evaporator 3.

KEY:
A-B—peripheral channels in relation to the finned surface, which act as inlets, outlets or conveyors according to the fluid flow direction
AL—cooling fins
BA—finned base heat sink-evaporator
C—heat sink-evaporator cover
D—optional spacer between cover and base
I—refrigerating fluid inlet pipe/manifold
U—refrigerating fluid outlet pipe/manifold

The invention claimed is:

1. A two-phase, forced-convection cooling system, wherein a closed hydraulic circuit apparatus of a heat transfer refrigerating fluid is provided, comprising:
a pump for pumping a refrigerating fluid which, at least in some stretches of the circuit, is two-phase liquid-vapor or multiphase,
a heat sink-evaporator configured to transfer heat by conduction from a component to be cooled to the refrigerating fluid,
a condenser, capable of condensing the vapor which develops on the evaporator while simultaneously dissipating into the environment the heat given by the refrigerating fluid both by conduction, convection and radiation and by condensation,
a tank which also acts as an expansion vessel, or a tank and an expansion vessel which are distinct and connected to each other,
a plurality of sensors, comprising flow rate, pressure and temperature sensors and an electronic control system of the pump;
wherein said heat sink-evaporator has a base constituted by a plate made of thermal conductive material, with a lower surface in contact with the component to be cooled and an upper surface on which a plurality of mutually parallel or convergent/divergent fins is present, which fins define a corresponding plurality of channels; wherein each of said channels is delimited by two adjacent fins and by the surface of the base itself present therebetween, and
wherein said heat sink-evaporator comprises a casing comprising a base and a cover, which define together the mandatory passages for the cooling fluid.

2. The cooling system according to claim 1, further comprising a heat exchanger, which acts as a recuperator between the two-phase or multiphase fluid exiting from the evaporator and the fluid entering into the evaporator itself.

3. The cooling system according to claim 1, wherein said hydraulic circuit is a closed loop in which the refrigerating fluid present in two-phase liquid-vapor or multiphase is circulated by said pump.

4. The cooling system according to claim 3, wherein said refrigerating fluid from the pump is in a liquid phase, partially switching from the liquid state to the vapor state in the evaporator, under control of an electronic system for adjusting the pump flow rate, the system pressure and the air flow speed to the condenser, so as to keep the evaporation and the temperature of a surface to be cooled at a predetermined level.

5. The cooling system according to claim 4, further comprising means configured to control the vapor content (vapor quality), in order to effect heat dissipation as the latent evaporation heat is also extracted; for this purpose, means being provided in order to manage the evaporation control and the successive condensation by sensors arranged in the circuit which send their signals to an electronic control board which controls both the pump flow rate and the condenser fan speed.

6. The cooling system according to claim 1, wherein said mandatory passages are defined by the provision of additional elements selected from the groups consisting of baffles, conveyors and reducers.

7. The cooling system according to claim 1, wherein the upper side of each channel is either closed by a lower surface of the cover or is open with the lower surface of the cover placed at a predetermined distance from the free end of the fins, or the cover has a lower surface configured to close the upper side of some of said channels.

8. The cooling system according to claim 1, wherein a system of seals is provided between the base and the cover to ensure the fluid-tightness of the system, or a spacer element is provided between the cover and the base, which spacer element may optionally contain the system of seals to ensure the fluid-tightness of the heat sink with the base and the cover, respectively.

9. The cooling system according to claim 1, wherein said channels, also referred to as micro-channels, present on the upper surface of the base of the heat exchanger:
   all have either the same length or mutually non-uniform lengths;
   the height of the fins defining the channels is either uniform or non-uniform, and in the case of non-uniform height:
      the fins have decreasing heights in linear, quadratic, cubic, etc. manner from an inlet or outlet side to the opposite side;
      or have decreasing heights from the center toward the ends or vice versa, wherein
   said fins have a discontinuous surface, having openings or holes which connect a channel to at least one adjacent channel, and
   wherein the body of the fins is either orthogonal to the surface of the base or inclined with respect thereto.

10. The cooling system according to claim 1, wherein the refrigerating fluid flow is either parallel or transverse to the axis of the channels, or oblique thereto if the channels are arranged according to an angle with respect to the flow axis, said cooling system being configured so that, during the flow towards the heat exchanger outlet, the refrigerating fluid changes from the liquid phase to the vapor phase in the micro-channels.

11. The cooling system according to claim 1, wherein the surface wetted by the refrigerating fluid contains a pair of peripheral channels (A and B) with respect to the finned surface, which act as inlets, outlets or conveyors according to the fluid flow direction; wherein said peripheral channels (A, B) can be obtained either in the base or in the cover or in a spacer interposed therebetween; such channels being configured to allow an easy removal of the vapor from the heat transfer surface.

12. The cooling system according to claim 1, wherein the surface of the micro-channels is either polished or sand-blasted or rough with a parameter of roughness Ra in the range of: 0.01 microns-500 microns,
   wherein the finish of the lower surface of the base is either rough or polished with a roughness described by a parameter Ra in the range: 0.05 μm-500 μm.

13. The cooling system according to claim 12, wherein said surface of the micro-channels includes micro-structures of:
   sintered powder with particle size in the range: 0.05 μm-1000 μm;
   special paint or coating: 3M© coating system;
   paint or coating:
   chemical finishes.

14. The cooling system according to claim 1, wherein the longitudinal axis of the channels delimited by the fins is either parallel to or inclined with respect to one of the sides,
   wherein said channels are arranged either in a "V" or are wavy or fretted.

15. The cooling system according to claim 1, wherein the base plate of the heat sink-evaporator is made of materials which are high heat conductors.

16. The cooling system according to claim 1, wherein the base plate of the heat sink-evaporator is manufactured by sintering metals including: copper and molybdenum, copper and graphite, aluminum and graphite, etc. and other materials; or by chip forming techniques with CNC machines, 3D printing techniques of the additive manufacturing type (SLS, DMLS) or other mechanical processes,
   wherein the lower surface of the base is flat or has a concave or convex structure.

17. The cooling system according to claim 6, wherein in order to effect the heat exchange towards the refrigerating fluid, the evaporator/liquid interface surface on which said fins are formed, is chemically and/or mechanically treated.

18. The cooling system according to claim 1, further comprising, in combination: a low-flow rate pump, a tank acting as a expansion vessel, a further condenser configured to act as a liquid/liquid heat exchanger or liquid/air heat exchanger provided with ventilation fans for heat dissipation, an electronic control system comprising sensors and actuators connected to an electronic controller, as well as a plurality of connecting pipes between the various parts, which pipes have lengths and diameters configured to maximize the heat dissipation.

19. The cooling system according to claim 1, wherein the inlet of the refrigerating fluid in said heat sink-evaporator is:
   either tangential or oblique to the upper surface or to the base of the fins,
or
   from above, perpendicular to the finned base, in the center of the base or along lines or surfaces on the top surface of the heat sink-evaporator.

* * * * *